United States Patent [19]

Jun

[11] Patent Number: 5,587,331
[45] Date of Patent: Dec. 24, 1996

[54] METHOD OF FORMING A CONTACT HOLE FOR A METAL LINE IN A SEMICONDUCTOR DEVICE

[75] Inventor: Young-Kwon Jun, Seoul, Rep. of Korea

[73] Assignee: Goldstar Electron Co., Ltd., Chungcheongbuk-do, Rep. of Korea

[21] Appl. No.: 168,247

[22] Filed: Dec. 17, 1993

[30] Foreign Application Priority Data

Dec. 19, 1992 [KR] Rep. of Korea ............... 1992-24804

[51] Int. Cl.⁶ .................................................. H01L 21/44
[52] U.S. Cl. .................................................. 437/41; 437/190
[58] Field of Search .................................. 437/228, 200, 437/196, 41, 190, 192, 195; 257/751

[56] References Cited

U.S. PATENT DOCUMENTS

| | | | |
|---|---|---|---|
| 4,962,414 | 10/1990 | Liou et al. | 457/71 |
| 5,030,588 | 7/1991 | Hosaka | 437/60 |
| 5,094,965 | 3/1992 | Ozaki et al. | 437/40 |
| 5,094,981 | 3/1992 | Chung et al. | 437/190 |
| 5,240,872 | 8/1993 | Motonami et al. | 437/47 |
| 5,246,882 | 9/1993 | Hartmann | 437/195 |
| 5,246,883 | 9/1993 | Lin et al. | 437/195 |
| 5,266,156 | 11/1993 | Nasr | 156/656 |
| 5,275,972 | 1/1994 | Ogawa et al. | 437/195 |
| 5,308,783 | 5/1994 | Krautschneider et al. | 437/52 |
| 5,371,041 | 12/1994 | Liou et al. | 437/190 |
| 5,397,744 | 3/1995 | Sumi et al. | 437/200 |

FOREIGN PATENT DOCUMENTS 3-80542A 4/1991 Japan.

*Primary Examiner*—George Fourson
*Assistant Examiner*—S. Mulpuri
*Attorney, Agent, or Firm*—Finnegan, Henderson, Farabow, Garrett & Dunner, L.L.P.

[57] ABSTRACT

A method for forming a contact hole for a metal line in a semiconductor device, including the steps of forming a contact area on a semiconductor substrate to be connected to a metal line, forming a groove, of which side is insulated from a contact portion on a bottom and at a side of the groove, forming an insulating layer on a whole surface of the semiconductor substrate, and forming a contact hole by removing a portion of the insulating layer on the barrier metal contact portion.

9 Claims, 3 Drawing Sheets

5,587,331

METHOD OF FORMING A CONTACT HOLE FOR A METAL LINE IN A SEMICONDUCTOR DEVICE

BACKGROUND OF THE INVENTION

1. Field of the Invention

The present invention relates to a method of forming a contact hole for a metal line in a semiconductor device, particularly enabling an improved integrity of the barrier metal at the contact area.

2. Background of the Invention

In a conventional method of forming a metal line in a semiconductor device, the step coverage and the integrity of a barrier metal are deteriorated by a shadow effect of contact hole in a sputtering process of a barrier metal to be deposited on the contact area as the aspect ratio of the contact hole increases.

FIG. 1 shows a partial sectional view of a semiconductor for explanation of conventional method for forming a metal line in a semiconductor device.

As shown in FIG. 1(A), a gate silicon oxide layer 12, a polysilicon layer 13 for a gate, and a cap gate silicon oxide layer 14 are deposited on a silicon substrate 11 in that order.

As shown in FIG. 1(B), the cap gate silicon oxide 14, the polysilicon layer 13, and the gate silicon oxide layer 12 are etched by photolithograpy, to form a gate 13' and a portion of the silicon substrate 11 is exposed.

Then, a source/drain junction 15 is formed at the exposed portion of the silicon substrate 11 by usually an ion implantation and thermal treatment.

As shown in FIG. 1(c), a silicon oxide layer 16 is deposited on a resulting surface, i.e., on the cap gate silicon oxide layer 14, at the side of the gate 13', and the source/drain junction 15.

Then, a side wall spacer 16 is formed at the side of the gate 13' and the cap gate silicon oxide 14 by etching anisotropically the silicon oxide layer 16.

A bit line and a capacitor (not shown) are formed after the side wall spacer 16 is formed, resulting in a height undulation of more than 1 μm between a circuit region and a cell area.

Accordingly, a depth of focus for photo lithography is secured by depositing BPSG 17 or 03-USG(ozone-undoped silicate glass) of more than 5000 Å and then letting it flow for planarization, thus eliminating the undulation.

As shown in FIG. 1(D), an insulating layer 17 is formed on the circuit region to a thickness of more than 1 μm.

As shown in FIG. 1(E), a contact hole 18 is opened onto the source/drain 15 by photolithography, where the aspect ratio of the contact hole 18 becomes more than 2 if the contact hole has a diameter less than 0.5 μm.

As shown in FIG. 1(F), a barrier metal 19 is deposited in the contact hole 18 and on the insulating layer 17 by a sputtering method. Compounds such as Ti, TiN, TiW, and MoSi2, may be used for the barrier metal.

If the aspect ratio of the contact hole is more than 2, the step coverage of the barrier metal 19 onto the source/drain 15 degrades due to the shadow effect of the contact hole 18, resulting in a low integrity of the barrier metal at a corner portion 19' of the contact hole. Sometimes, the barrier metal is not sputtered at a edge, thus a metal formed in the next step contacts directly to the silicon surface.

As silicon in the source/drain 15 and metal of a metal line (not shown, e.g. Al) contact directly at a fringe of the source/drain 15 on which the barrier metal is not deposited, a spiking effect occurs, resulting in a bad contact characteristic.

SUMMARY OF THE INVENTION

In order to overcome the above described disadvantages of the conventional method, the present invention improves barrier metal integrity at the lowermost part of the contact hole in spite of an aspect ratio which is bigger than 2, resulting in an improved contact characteristic of a metal line.

It is an object of the present invention to provide a method for forming a contact hole to connect a metal line to a semiconductor substrate through the contact hole, including the steps forming a contact area on a semiconductor substrate to be connected to a metal line; forming a groove, of which side is insulated from a conductive layer, on the contact area; forming a barrier metal contact portion on a bottom and at a side of the groove; forming an insulating layer on a whole surface of the semiconductor substrate; and forming a contact hole by removing a portion of the insulating layer on the barrier metal contact portion.

It is another object of present invention to provide a method for forming a contact hole to connect a metal line to a semiconductor substrate through the contact hole, including the steps depositing a gate silicon oxide layer, a polysilicon layer for a gate, and a cap gate silicon oxide layer on the semiconductor substrate, respectively; etching the cap gate silicon oxide layer, the polysilicon layer, and the gate silicon oxide layer to form a gate electrode pattern and exposing a portion of the semiconductor substrate by a photolithography process; forming a source/drain junction at the exposed portion of the semiconductor substrate by ion implantation and thermal diffusion; depositing a silicon oxide layer on a surface and etching it back, forming a side wall spacer at the side of the gate and the cap gate silicon oxide; depositing a barrier metal layer on the cap gate silicon oxide layer, at the side of the side wall spacer, and on the source/drain junction; depositing a first insulating layer on the barrier metal layer; forming a barrier metal protector with the first insulating layer by the photolithography process, the protector being enough to cover the contact area; etching the barrier metal layer using the barrier metal protector as a mask, forming a barrier metal contact portion; depositing a second insulating layer on a surface having an etching selectivity against silicon oxide on the cap gate silicon oxide, the side wall spacer, and the barrier metal; carrying out a process for cell fabrication on the silicon substrate; forming a third insulating layer on a surface; and forming a contact hole on the barrier metal contact portion by etching the third, second, and first insulating layer.

A further object of the present invention is to provide a method of forming a contact hole for a metal line in a semiconductor device, including the steps of depositing a gate silicon oxide, a polysilicon, and a cap gate silicon oxide on the semiconductor substrate, respectively; forming a gate by etching the cap gate silicon oxide, the polysilicon, and the gate silicon oxide, and exposing a portion of the semiconductor substrate; forming a contact area at the exposed portion of the semiconductor substrate by ion implantation and thermal diffusion; forming a groove insulated with a insulator side wall between two gate electrodes by depositing a first insulating layer over the contact area and etching it back; forming a barrier metal contact portion inside the groove; forming a bit line and a capacitor over the substrate; forming a second insulating layer over the silicon substrate; and forming a contact hole to connect a metal line to the contact area through the contact hole.

It is still another object of the present invention to provide a semiconductor device having a contact hole structure for connecting a metal line to a contact area on a semiconductor substrate including a "U" shaped barrier metal contact portion having a bottom contacting the contact area of the semiconductor substrate and being insulated from surroundings except the contact area; and an insulating layer surrounding a hole from an upper end of the "U" shaped barrier metal contact portion to a surface of the insulating layer. The base area of the barrier metal is not less than the surface of the contact area.

BRIEF DESCRIPTIONS OF THE DRAWINGS

The above objects and other advantages of the present invention will be more apparent by describing in detail the preferred embodiment of the present invention with reference to the attached drawings.

FIGS. 1(A)–1(F) show partial sectional views of a semiconductor device for explanation of a conventional method of forming a contact hole for a metal line in a semiconductor device.

FIGS. 2(A)–2(K) show partial sectional views of a semiconductor device for explanation of a method of forming a metal line in a semiconductor device according to the present invention.

DESCRIPTION OF THE PREFERRED EMBODIMENT

FIGS. 2(A)–2(K) show a method of forming a metal line in a semiconductor device. Particularly, FIGS. 2(A)–2(K) show a method of forming a contact hole and a barrier metal contact portion with cross sectional views according to the present invention.

Figure 1A:
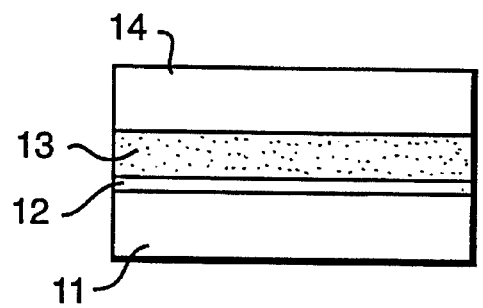
Figure 1B:
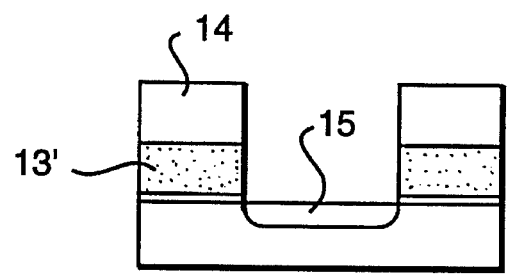
Figure 1C:
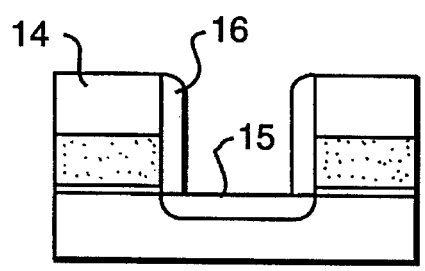
Figure 1D:
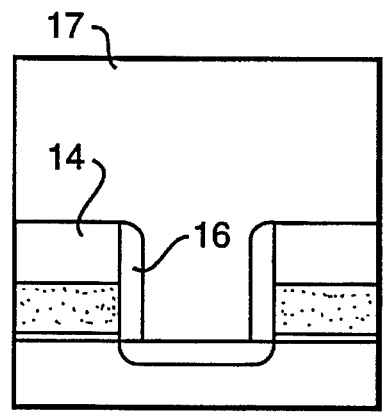
Figure 1E:
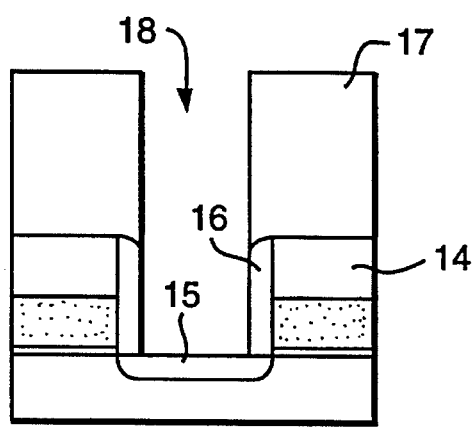
Figure 1F:
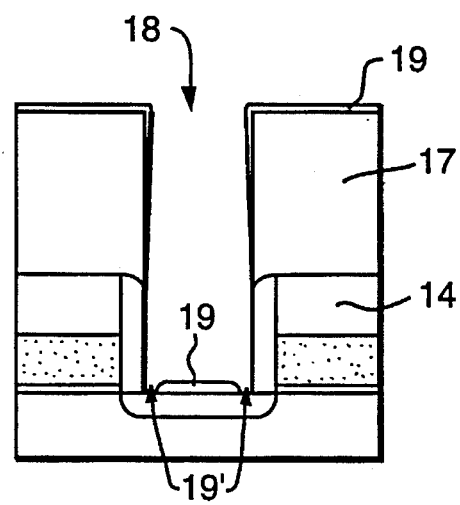
Figure 2A:
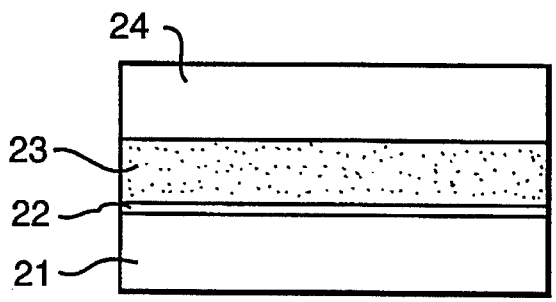

As shown in FIG. 2(A), a gate silicon oxide layer 22, a polysilicon layer 23 for a gate (electrode), and a cap gate silicon oxide layer 24 are respectively deposited on a silicon substrate 21.

Figure 2B:
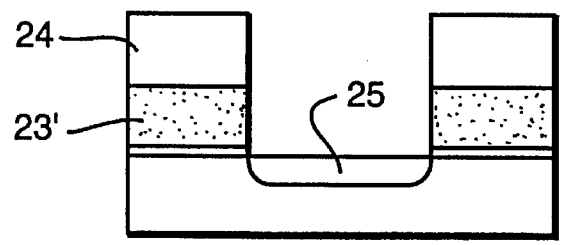

As shown in FIG. 2(B), a gate pattern 23' is made by etching the cap gate silicon oxide layer 24, the polysilicon layer 23, and the gate silicon oxide layer 22 using a photolithography process. Thus, a portion of the silicon substrate 21 is exposed.

Then, a source/drain junction 25 is formed at the exposed portion of the silicon substrate 21 by usually an ion implantation and thermal diffusion.

Figure 2C:
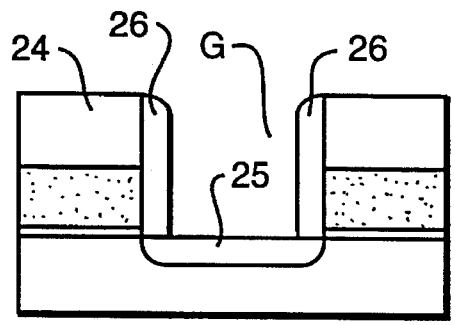

Next, as shown in FIG. 2(C), a silicon oxide layer 26 is deposited on a resulting surface, i.e., on the cap gate silicon oxide layer 24, at the side of the gate 23', and on the source/drain junction 25.

Then, a side wall spacer 26 to insulate the gate 23' electrically is formed at the side of the gate 23' and the cap gate silicon oxide 24 by depositing the silicon oxide layer 26 and etching it back anisotropically, thus forming a groove G having three planes—a surface of the source/drain junction; and surfaces of two side wall spacers 26.

Figure 2D:
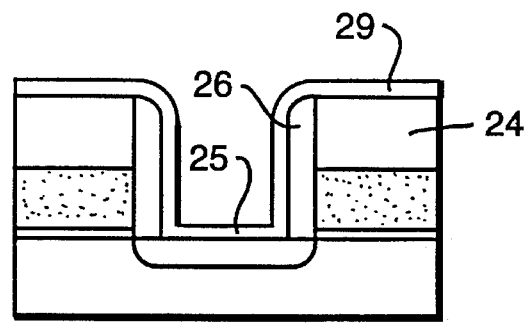

As shown in FIG. 2(D), a barrier metal layer 29 is deposited by a sputtering method on an entire resulting surface including the cap gate silicon oxide 24, the side of the side wall spacer 26, and on the source/drain junction 25 (the inside the groove G region). One of Ti, TiN, TiW, and MoSi2 may be used for the barrier metal 29.

Since the shadow effect decreases on account of the aspect ratio which is equal to or less than 1, the barrier metal 29 is fully deposited inside the groove G to provide an improved barrier metal integrity. A silicide can be used instead of the barrier metal.

Figure 2E:
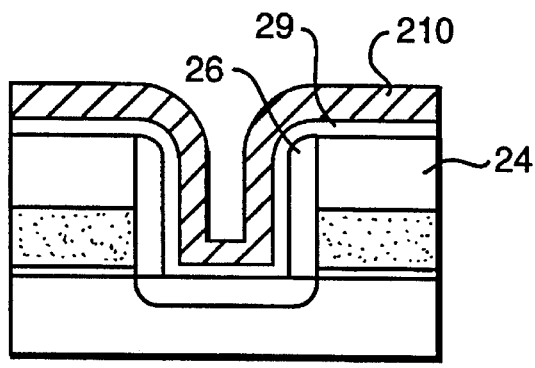

As shown in FIG. 2(E), an insulating layer 210 (first insulating layer) of silicon nitride is deposited on the barrier metal layer 29.

Figure 2F:
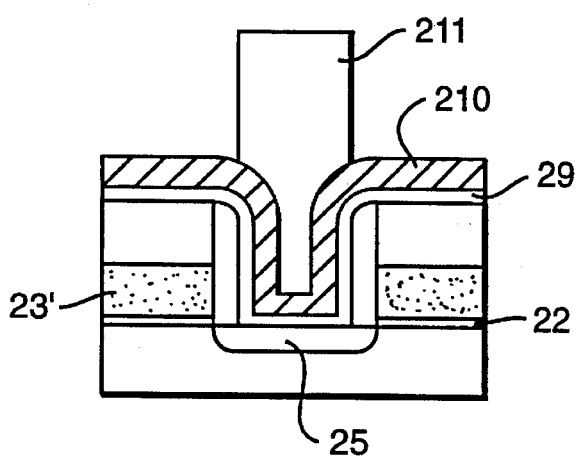

As shown in FIG. 2(F), photoresist is coated on the first insulating layer 210 and a photoresist pattern 211 to be used as a mask for etching the first insulating layer 210 is formed by exposure and development. The photoresist pattern 211 having a base line that is a little longer than a length of a surface of the source/drain junction 25, is formed above an overlapped plane which is imaged by downwardly viewing the surface of the source/drain junction 25 through the bottom plane of the barrier metal 29. The base lines are in parallel with the direction of the groove G.

Figure 2G:
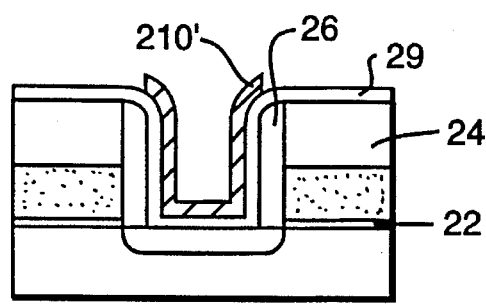

As shown in FIG. 2(G), the first insulating layer 210 is etched anisotropically using the photoresist pattern 211 as an etching mask, forming a barrier metal protector 210' of the first insulating layer 210 to be used as an etching mask. Subsequently, the photoresist pattern 211 is removed.

Figure 2H:
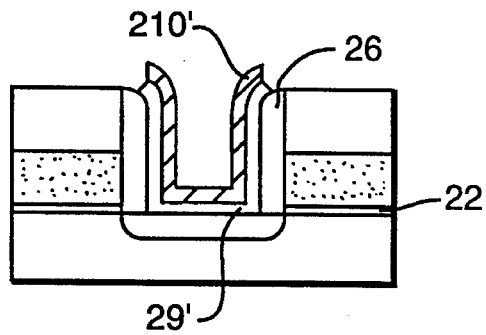

As shown in FIG. 2(H), the barrier metal layer 29 is etched anisotropically using the barrier metal protector 210' of the first insulating layer 210 as a mask and also the cap gate silicon oxide 24 as an etching stop layer, thus forming a barrier metal contact portion 29' which covers the contact area (the source/drain region 25).

Subsequently, the barrier metal contact portion 29' of the barrier metal 29 lies inside the groove i.e. on the source/drain junction 25 and at the side of the spacer 26, where the bottom part of the barrier metal contact portion 29' covers excessively the surface of the source/drain junction 25 but is protected by the side wall spacer 26.

Consequently, the excessive coverage over the surface of the source/drain junction 25 keeps a contact between a metal line and a semiconductor contact area (that will be formed later) from the "spiking" because the barrier metal contact portion 29 isolates silicon from the metal line.

In a different way, the barrier metal contact portion 29' of the barrier metal 29 can be formed by etching the first insulating layer 210 and the barrier metal 29 simultaneously.

Figure 2I:
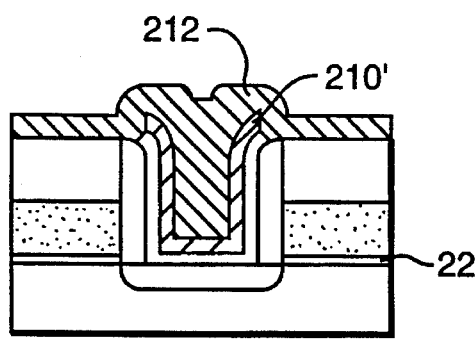

As shown in FIG. 2(I), a second insulating layer 212 is deposited on the cap gate silicon oxide 24, the side wall spacer 26, the barrier metal contact portion 29', and the first insulating layer 210. A material that has an etching selectivity against silicon oxide is used for the second insulating layer 212 such as silicon nitride or polyimide.

Figure 2J:
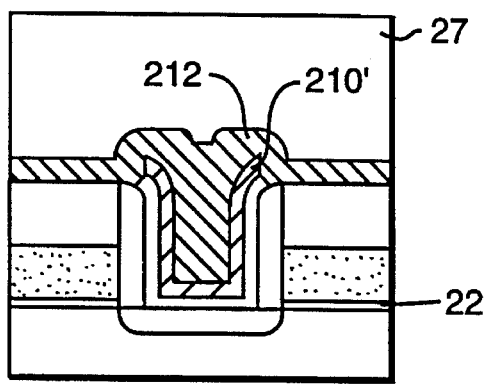

As shown in FIG. 2(J), a third insulating layer 27 is formed on the second insulating layer 212 after a general cell process is carried out, where the general cell process includes forming a bit line, making a capacitor, and planarizing an insulating layer.

Figure 2K:
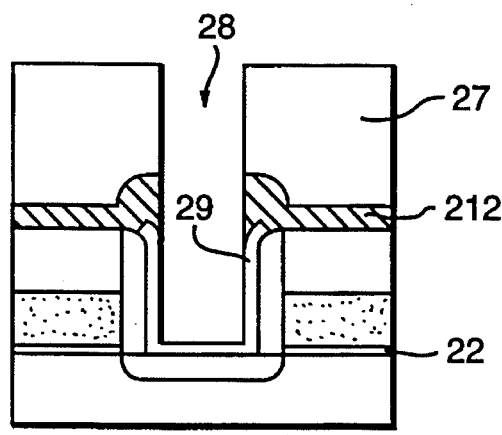

As shown in FIG. 2(K), a contact hole 28 is formed on a contact area which is included within the bottom plane of the barrier metal contact portion 29' on the source/drain junction 25 by etching anisotropically the third insulating layer 27 until the second insulating layer 212 is exposed and then etching the second insulating layer 212 and the first insulating layer 210 with the barrier metal contact portion 29' as an etch stop layer. It is preferable to etch the first insulating layer 210 by a wet etch process.

According to the present invention, as described above, an instability of the integrity of the barrier metal at the contact area between a metal line and a source/drain junction is prevented by forming a barrier metal at the contact area and improving the integrity of the barrier metal at the lowermost part of the contact hole in spite of an aspect ratio which becomes bigger than 2, resulting in an improved contact characteristic for the metal line and improved reliability of a semiconductor device.

What is claimed is:

1. A method for forming a contact hole to connect a metal line to a contact area on semiconductor substrate through said contact hole, the method comprising the steps of:

forming a first insulative layer on a surface of said semiconductor substrate;

forming a first contact hole in said first insulative layer to expose said contact area;

forming an insulative sidewall spacer on a sidewall surface of said contact hole;

depositing a barrier metal layer on said first insulative layer including said insulative sidewall spacer;

forming a barrier metal protective layer on said barrier metal layer, the barrier metal protective layer covering the contact area;

etching the barrier metal layer using the barrier metal protective layer as a mask;

forming a second insulative layer on said barrier metal protective layer and said first insulative layer; and forming a second contact hole by removing at least portions of said second insulative layer and said barrier metal protective layer in correspondence with said first contact hole, thereby exposing said barrier metal layer in said contact area.

2. The method as claim in claim 1, wherein the step for forming the barrier metal layer is processed by sputtering method.

3. A method for forming a contact hole to connect a metal line to a semiconductor substrate through the contact hole, the method comprising the steps of:

depositing a gate silicon oxide layer, a polysilicon layer, and a cap gate silicon oxide layer on the semiconductor substrate;

etching the cap gate silicon oxide layer, the polysilicon layer, and the gate silicon oxide layer for forming a gate electrode pattern and exposing a portion of the semiconductor substrate by a photolithography process;

forming a source/drain junction at the exposed portion of the semiconductor substrate by ion implantation and thermal diffusion;

depositing a silicon oxide layer on a resulting surface and etching the silicon oxide layer to form a side wall spacer at the side of the gate and the cap gate silicon oxide;

depositing a barrier metal layer on the cap gate silicon oxide layer, on the side of the side wall spacer, and on the source/drain junction;

depositing a first insulating layer on the barrier metal layer;

forming a barrier metal protector from the first insulating layer by the photolithography process, the protector covering the contact area;

etching the barrier metal layer using the barrier metal protector as a mask, forming a barrier metal contact portion;

depositing a second insulating layer having an etching selectivity against silicon oxide on the cap gate silicon oxide, the side wall spacer, and the barrier metal;

carrying out a process for cell fabrication on the silicon substrate;

forming a third insulating layer on a resulting surface; and forming a contact hole on the barrier metal contact portion by etching the third, second, and first insulating layers.

4. The method as in claim 3, wherein a silicide is used for the barrier metal.

5. The method as in claim 3, wherein the barrier metal contact portion is patterned by etching the first insulating layer and the barrier metal simultaneously using a photoresist pattern as an etching mask.

6. The method as in claim 3, wherein the second insulating layer is made of silicon nitride.

7. The method as in claim 3, wherein the second insulating layer is made of polyimide.

8. The method as in claim 3, wherein the barrier metal is deposited by sputtering.

9. The method as in claim 3, wherein the cell process comprises the steps of:

forming a bit line;

forming a capacitor; and depositing and planarizing an insulating layer.

* * * * *